US006268568B1

(12) United States Patent
Kim

(10) Patent No.: US 6,268,568 B1
(45) Date of Patent: Jul. 31, 2001

(54) PRINTED CIRCUIT BOARD WITH OVAL SOLDER BALL LANDS FOR BGA SEMICONDUCTOR PACKAGES

(75) Inventor: Sung Jin Kim, Seoul (KR)

(73) Assignees: Anam Semiconductor, Inc., Seoul (KR); Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/305,170

(22) Filed: May 4, 1999

(51) Int. Cl.[7] .................................................. H05K 7/06
(52) U.S. Cl. .......................... 174/250; 174/260; 361/768; 361/772; 361/777; 361/783; 257/738; 257/778; 257/779; 257/786
(58) Field of Search ....................... 361/748, 749, 361/760, 767, 768, 772, 773, 774, 777, 783; 257/737, 738, 773, 775, 778, 779, 786; 174/250, 253, 260, 261; 228/180.22; 438/108

(56) References Cited

U.S. PATENT DOCUMENTS

| | | | | |
|---|---|---|---|---|
| 5,170,931 | * | 12/1992 | Desai et al. ................... | 228/180.22 |
| 5,351,393 | * | 10/1994 | Gregoire ......................... | 361/774 |
| 5,484,963 | * | 1/1996 | Washino .......................... | 174/261 |
| 5,539,156 | * | 7/1996 | Chobot et al. ................. | 174/250 |
| 5,579,207 | * | 11/1996 | Hayden et al. ................ | 257/786 |
| 5,859,474 | * | 1/1999 | Dordi ............................... | 257/738 |
| 5,875,102 | * | 2/1999 | Barrow ............................. | 361/777 |
| 5,894,984 | * | 4/1999 | Sakai et al. ................... | 228/180.22 |
| 6,037,547 | * | 3/2000 | Blish, II ........................... | 361/777 |
| 6,133,134 | * | 10/2000 | Mehr ................................. | 257/773 |
| 6,143,991 | * | 11/2000 | Moriyama ....................... | 174/261 |

* cited by examiner

Primary Examiner—Jeffrey Gaffin
Assistant Examiner—John B. Vigushin
(74) Attorney, Agent, or Firm—Skjerven Morrill MacPherson LLP; Don C. Lawrence

(57) ABSTRACT

A PCB having oval solder ball lands, and a BGA semiconductor package produced using such a PCB, are disclosed. The PCB has a plurality of conductive traces forming circuit patterns on at least one of an upper and a lower surface of a resin substrate. A plurality of solder ball lands are formed on the lower surface of the substrate and are electrically connected to respective upper surface conductive traces. At least a portion of the solder ball lands have an oval shape and a major axis. The oval solder ball lands are oriented such that their major axes are either radially directed relative to a center of the substrate, perpendicularly directed relative to a side edge of the substrate, or both radially and perpendicularly directed relative the center and a side edge of the substrate, respectively. Solder balls welded to the oval lands have an improved strength capable of effectively resisting a shearing stress caused by a thermal expansion of the PCB during operation of a semiconductor chip, and the BGA package thus has a prolonged fatigue life. The oval solder ball lands also enlarge the width of a neck point between adjacent solder ball lands, thereby enabling a larger number of conductive traces to pass through the neck point.

18 Claims, 9 Drawing Sheets

FIG. 3B
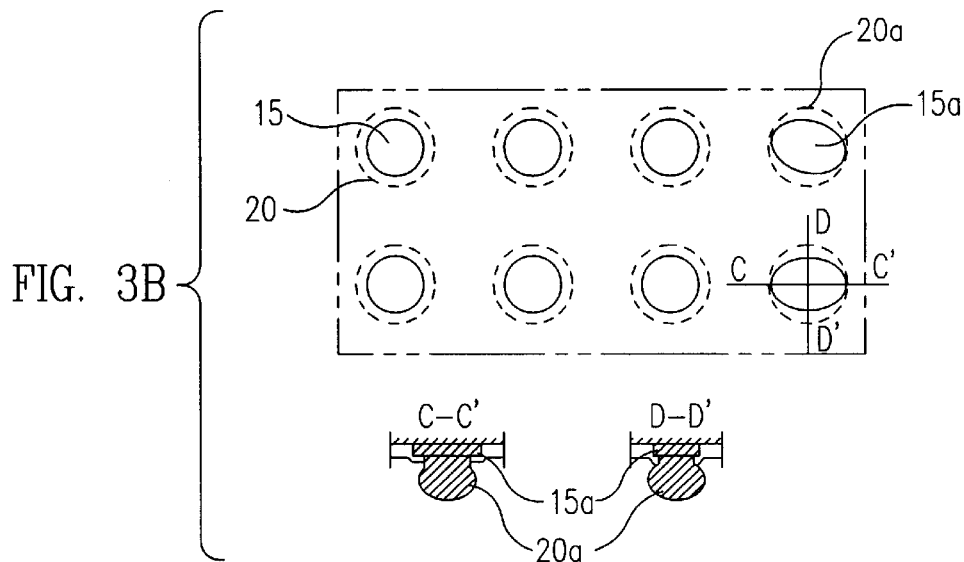
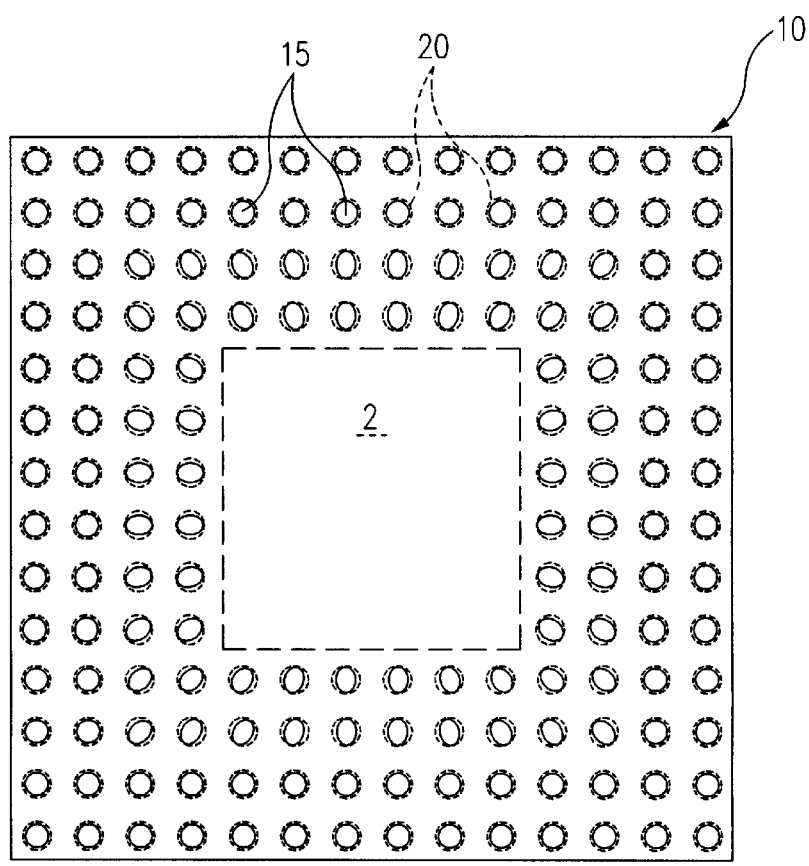
FIG. 3C

PRINTED CIRCUIT BOARD WITH OVAL SOLDER BALL LANDS FOR BGA SEMICONDUCTOR PACKAGES

BACKGROUND OF THE INVENTION

1. Field of the Invention

The present invention relates, in general, to a printed circuit board (PCB) and a semiconductor package produced using the PCB and, more particularly, to a high density, high reliability ball grid array (BGA) semiconductor package having oval-shaped solder ball lands for increased resistance to shear forces caused by thermal expansion.

2. Description of the Related Art

As is well known to those skilled in the art, typical BGA semiconductor packages, BGA semiconductor packages using flexible printed circuit boards, and chip scale semiconductor packages are all surface-mounted types of semiconductor packages, each of which has a semiconductor chip bonded to the upper surface of a circuit board using a bonding agent. A plurality of solder balls are welded to lands on the lower surface of the circuit board and are used as input/output signal terminals of the package. Since the above semiconductor packages are capable of effecting a large number of signal input/output terminals in a relatively small area, they comport well with the recent trend of semiconductor packages that are small, compact, light and thin, and for that reason, are widely preferred and used.

The basic construction of the above packages is similar, so only the construction of a typical BGA semiconductor package will be described hereinbelow in conjunction with FIGS. 1A and 1B.

In a typical BGA package, a semiconductor chip 2' having an integrated circuit and a plurality of signal input/output pads 4' on a surface thereof is bonded to the central portion of the upper surface of a printed circuit board (PCB) 10' by a bonding layer 6'. The PCB 10' comprises a resin substrate 11' having a circuit pattern on each of the upper and lower surfaces thereof. The circuit patterns on the upper and lower surfaces of the substrate 11' are formed by a plurality of conductive traces 12', 13', respectively. The conductive traces 12' and 13' are coated over with a high molecular resin solder mask 30', except at selected areas where it is desired to solder to them.

In more detail, a chip pad 16', which is a copper layer having a predetermined size, is formed on the central portion of the upper surface of the resin substrate 11' to receive and mount the chip 2'. The chip 2' is bonded to the pad 16' by a bonding layer 6'. A plurality of first conductive traces 12' are formed on the upper surface of the substrate 11' at positions spaced apart from the outside edge of the chip pad 16' and from each other at predetermined intervals, thereby forming an upper circuit pattern. The upper circuit pattern is coated with a solder mask 30'. A plurality of second conductive traces 13' are formed on the lower surface of the substrate 11' and are each electrically connected to an associated one of the first conductive traces 12' through conductive via holes 14'. A circular solder ball land 15', having a double-layered construction comprising a nickel layer 15b' and a gold layer 15c', is formed on each of the second conductive traces 13' through either an electrolytic plating process or an electroless plating process. A solder ball 20', made of an Sn/Pb alloy, is welded to each of the solder ball lands 15' and is used as a signal input/output terminal of the package 100' during signal communication of the package 100' with a main board m' (see FIG. 1D). The signal input/output pads 4' of the chip 2' are electrically connected to the first conductive traces 12' using an electrical connection means 40', such as a plurality of gold or aluminum wires or bumps, respectively. The semiconductor chip 2' and the electrical connection means 40' are encapsulated using a packaging material, such as epoxy molding compound or "glop top," thereby forming an envelope 50' on one side of the package. The envelope 50' protects the chip 2' and the electrical connection means 40' from intrusion of harmful electrical, mechanical and chemical environmental elements.

The above BGA package 100' communicates signals with a main board. During such communication, a signal from the semiconductor chip 2' passes through the electric connection means 40', the resin substrate 11', the first conductive traces 12' on the upper surface of the substrate 11', the conductive via holes 14', the second conductive traces 13' on the lower surface of the substrate 11', the circular solder ball lands 15', and the solder balls 20', in that order, prior to being transmitted to the main board. When the package 100' is activated by electric power supplied from a power source, the chip 2' performs its intrinsic electrical functions.

However, a typical BGA package 100' having circular solder ball lands 15' is somewhat problematic in that the fatigue life of the solder balls 20' welded to the lands 15' is somewhat short for reasons discussed below, and this reduces the operational reliability of the package 100'. In addition, the width of each neck point between the solder ball lands 15' is relatively narrow, thus limiting the number of second conductive traces 13' that can be formed within such neck points. This, in turn, limits the design flexibility of the BGA packages. Such problems are described in more detail hereinbelow in conjunction with FIGS. 1B to 1D.

When the BGA package 100' is mounted on the surface of a main board m' and in operation, the chip 2' typically generates heat. The amount of heat generated by the chip 2' typically increases in proportion to the clock frequency. The heat from the chip 2' is radially dissipated to the surroundings by the PCB 10' positioned under the chip 2', as shown in FIGS. 1A and 1B. The amount of heat transferred to the PCB 10' by the chip 2' is greatest at the portion of the PCB 10' closest to the outside edge of the chip 2', relative to portions more remote from the chip's edge, as shown schematically in the graph of FIG. 1C. In FIG. 1C, the central perpendicular axis of the graph corresponds to the outside edge of the chip 2'.

When the temperatures of both the chip 2' and the PCB 10' increase as described above, the PCB 10' expands. However, since the solder balls 20' welded to the solder ball lands 15' of the package 100' are fixed on the main board m', a shearing stress is applied to both the lands 15' and the solder balls 20' in a radial direction around the center of the chip 2'.

This shearing stress in the lands 15' and the solder balls 20' is higher in those that are closer to the chip 2' than in those that are more remote from the chip 2' as shown in FIG. 1D. In FIG. 1D, the level of the shearing stress a, b, c and d acting on the lands 15' and the solder balls 20' varies in accordance with the position of the lands 15' and the solder balls 20' relative to the chip 2', that is, a>b>c>d. When the shearing stress is too high for the lands 15' and the solder balls 20' to resist, they can fracture, and the fatigue life of the solder balls 20' is substantially reduced. The solder balls 20' will ultimately fracture, beginning with the solder balls 20' closest to the chip 2', and proceeding outward to the solder balls 20' furthest away from the chip 2'. It should be noted that a BGA package 100' will typically fail to function totally when only one solder ball 20' fractures. Since the solder balls 20' can easily fracture due to the thermal expansion shearing stress described above, the operational reliability of the BGA package 100' is seriously reduced.

If the second conductive traces 13' and the circular solder ball lands 15' are formed through an electrolytic plating process during the manufacture of the BGA packages 100', thermal fracture occurs mainly at the interface between the nickel and gold layers of each land 15'. On the other hand, if the conductive traces 13' and the solder ball lands 15' are formed through an electroless plating process, thermal fracture occurs mainly at the interface between each of the lands 15' and an associated solder ball 20'.

Another problem with typical BGA package 100' using circular solder ball lands 15' is caused by the narrow neck point between the solder ball lands 15'. That is, when the PCB 10' is manufactured according to a typical 0.18 mm pitch design rule wherein the width of each second conductive trace 13' is set to 90 mm and the width of each channel between the second conductive traces 13' is set to 90 mm, it is possible for a BGA package 100' having a solder ball pitch of 1.27 mm and a solder ball diameter of 0.8 mm to have only two or less conductive traces 13' in the neck point. This severely limits the design flexibility of BGA packages and runs contrary to the recent trend toward packages that are smaller, more compact, lighter and thinner. This design limitation is especially limiting in the region closest to the semiconductor chip 2' of each package and prevents the assembly of high density BGA packages.

SUMMARY OF THE INVENTION

The present invention has been made with the above problems of the prior art in mind, and accordingly, an object of the present invention is to provide a circuit board having a plurality of oval solder ball lands and a BGA semiconductor package using such a circuit board. The oval solder ball lands of the circuit board endow a solder ball welded to such a land with increased strength, enabling it to effectively resist thermal expansion shearing stress, thereby resulting in extended fatigue life and improved operational reliability of the BGA package. The oval solder ball lands also enlarge the width of each neck point between the solder ball lands, thereby enabling a larger number of conductive traces to be positioned in the neck point, and hence, the assembly of packages having a higher density.

The present invention provides a printed circuit board, comprising; a resin substrate; a plurality of conductive traces forming a circuit pattern on an upper surface of the substrate; and, a plurality of solder ball lands formed on a lower surface of the substrate and electrically connected to respective ones of the conductive traces on the upper surface of the substrate. At least a portion of the solder ball lands each has an oval shape, with major and minor axes. The oval solder ball lands are arranged on the substrate such that the major axes of the oval solder ball lands are symmetrically directed toward the center of the substrate.

The present invention also provides a semiconductor package, comprising: a semiconductor chip and a printed circuit board carrying the semiconductor chip thereon. The printed circuit board comprises: a resin substrate; a plurality of conductive traces forming a circuit pattern on an upper surface of the substrate; and, a plurality of solder ball lands formed on a lower surface of the substrate and electrically connected to respective ones of the conductive traces on the upper surface of the substrate. At least a portion of the solder ball lands each has an oval shape, with major and minor axes. The oval solder ball lands are arranged on the substrate such that major axes of the oval solder ball lands are radially directed toward the center of the semiconductor chip. Electrical connection means are provided for electrically connecting the semiconductor chip to the conductive traces of the printed circuit board, and a plurality of solder balls are welded to the respective solder ball lands and comprise signal input/output terminals of the package.

BRIEF DESCRIPTION OF THE DRAWINGS

The above and other objects, features and advantages of the present invention will be more clearly understood from the following detailed description taken in conjunction with the accompanying drawings, in which:

FIG. 3B is an enlarged view of the dotted portion B of FIG. 3A;

FIGS. 3C to 3F are bottom plan views showing semiconductor packages in accordance with the second to fifth embodiments of the present invention, respectively;

DETAILED DESCRIPTION OF THE INVENTION

Figure 1A:
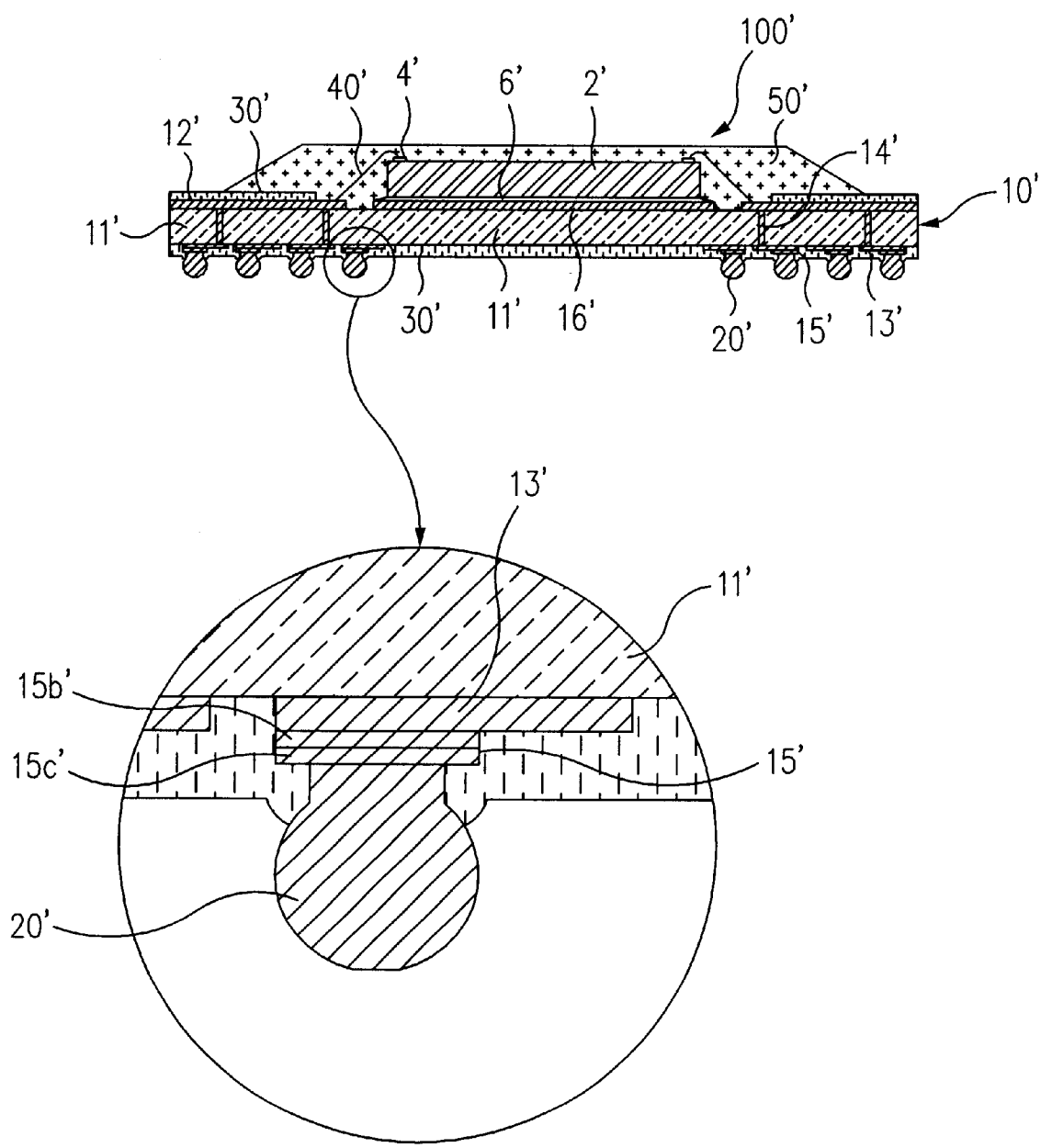
FIG. 1A is a sectional view, showing the construction of a typical BGA semiconductor package.
Figure 1B:
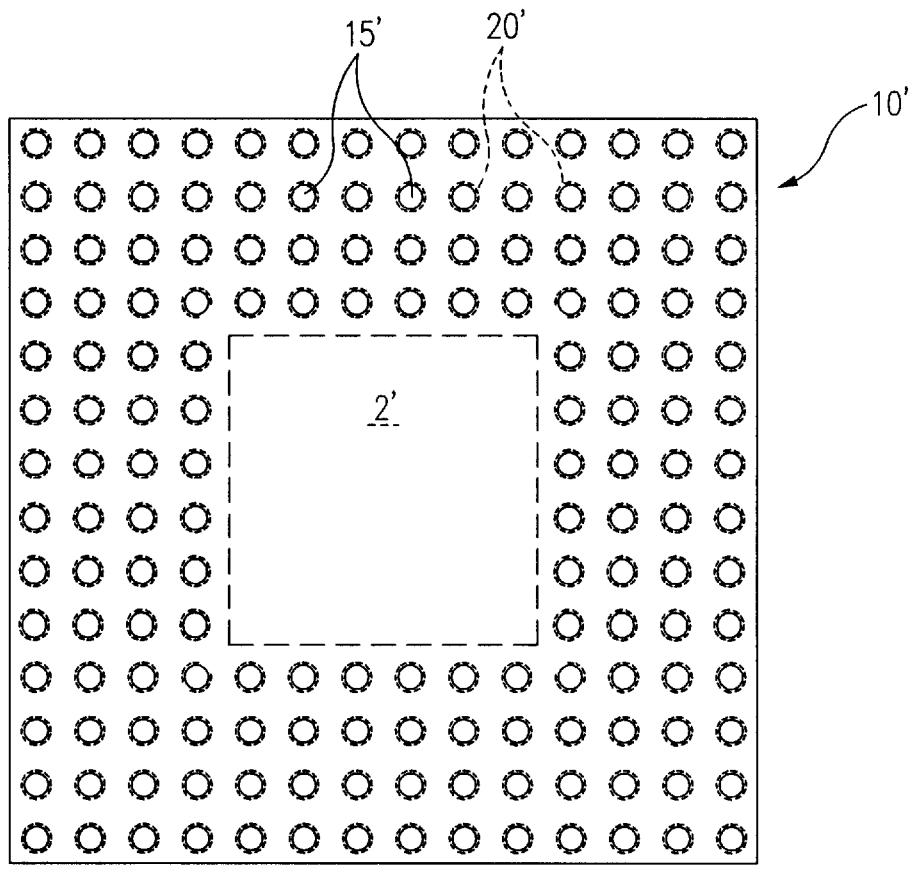
FIG. 1B is a bottom plan view of the typical BGA semiconductor package of FIG. 1A.
Figure 1C:
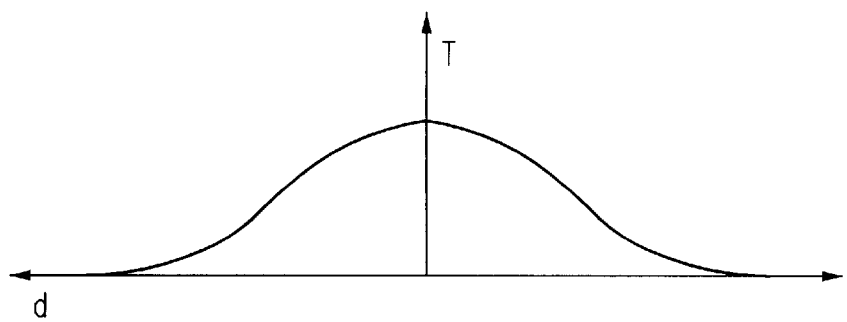
FIG. 1C is a graph showing the temperature distribution in the PCB of the typical BGA package in FIGS. 1A and 1B as a function of the distance from the outside edge of the chip.
Figure 1D:
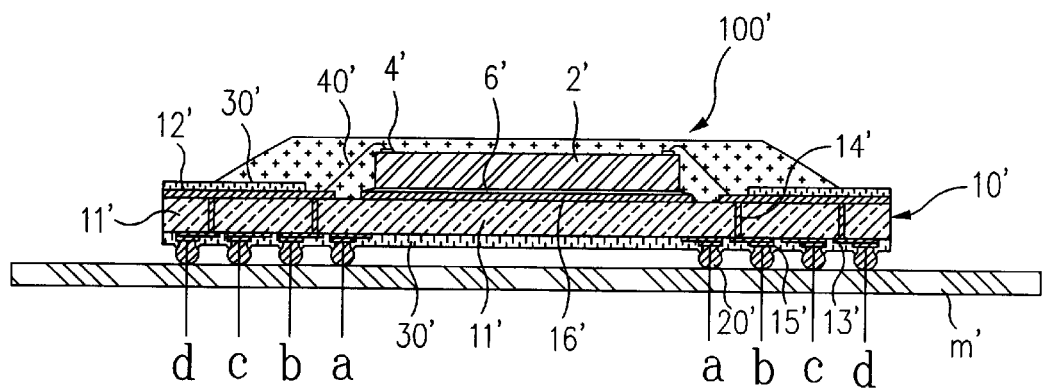
FIG. 1D is a sectional view showing the typical BGA semiconductor package of FIG. 1A mounted to a main board.
Figure 2A:
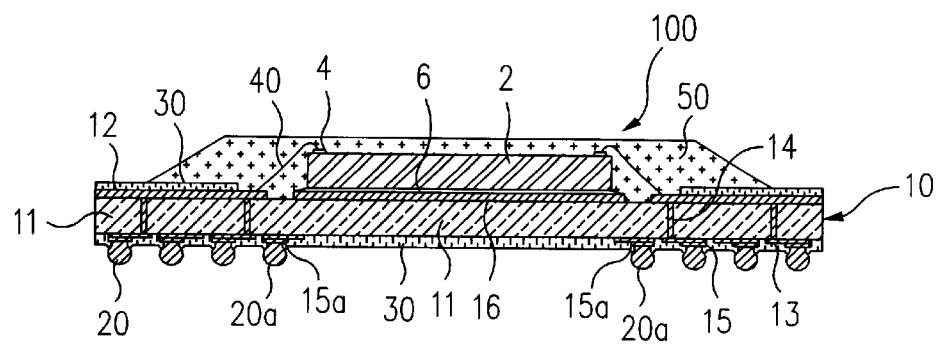
FIG. 2A is a sectional view showing the construction of a BGA semiconductor package according to a first embodiment of this invention.

FIG. 2A is a sectional view showing the construction of a BGA semiconductor package 100 according to a first embodiment of this invention. As shown in the drawing, the BGA package 100 has a semiconductor chip 2 bonded to the central portion of the upper surface of a printed circuit board (PCB) 10 by a bonding layer 6. The chip 2 is a semiconductor device having an integrated circuit and a plurality of signal input/output pads 4 along an outside edge on the upper surface thereof.

The PCB 10 comprises a resin substrate 11, made of, e.g., bismaleide triazine or other thermosetting resin composite reinforced with glass fiber. A chip mounting pad 16, e.g., a copper layer having a predetermined size, is formed on the central portion of the upper surface of the resin substrate 11. The PCB 10 also has a circuit pattern on each of the upper and lower surfaces thereof. The upper circuit pattern is formed by a plurality of first conductive traces 12, which are formed on the upper surface of the substrate 11 at positions spaced apart from the outside edge of the chip pad 16 by a predetermined distance.

Similarly, a plurality of second conductive traces 13 are formed on the lower surface of the substrate 11 to form the lower circuit pattern. A circular solder ball land 15 and/or an oval solder ball land 15a, each of the two types of lands 15 and 15a having a double-layered construction comprising a nickel layer and a gold layer, is formed on each of the second conductive traces 13. The first and second conductive traces 12 and 13 of the substrate 11 are electrically connected to each other through a plurality of conductive via holes 14.

A high molecular resin solder mask 30 coats each of the conductive traces 12 and 13 except at selected areas over the solder ball lands 15 and 15a, the chip pad 16, and the inside ends of the first traces 12, which are left exposed through the solder mask 30. The solder masks 30 serve to insulate the conductive traces 12 and 13 from each other and to protect the conductive traces 12 and 13 from the atmosphere.

Figure 3A:
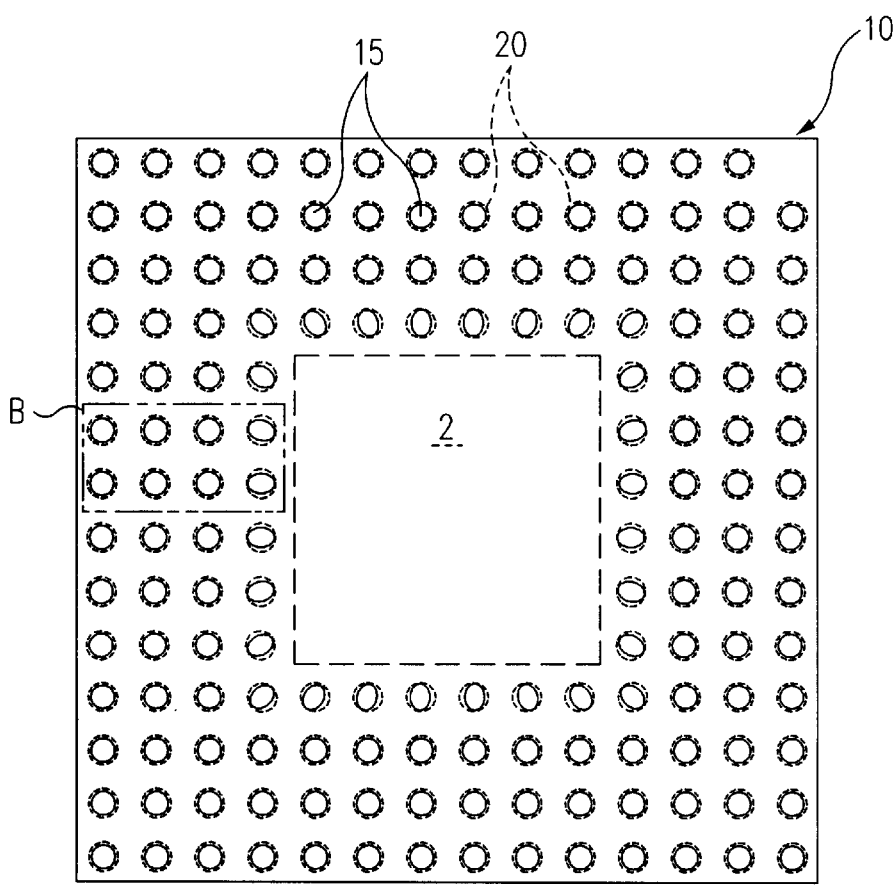
FIG. 3A is a bottom view of a BGA semiconductor package in accordance with the primary embodiment of the present invention.

In the first embodiment, the solder ball lands 15a that are positioned along the outside edge of the chip 2 have an oval configuration when seen from the bottom of the package 100. The solder ball lands 15a have major and minor axes, and are arranged along the outside edge of the chip 2 such that the major axis of each land 15a is directed in a generally radial direction relative to the center of the chip 2, as best seen in FIG. 3A.

It should be understood in the context of this invention that the term "oval," as used throughout herein, is meant to encompass shapes that are both truly oval, i.e., having an outline with straight, parallel (or slightly diverging) sides, capped at both ends by a semi-circle (or a segment thereof), as well as those that are elliptical, or egg-shaped, in appearance.

The signal input/output pads 4 of the chip 2 are electrically connected to the first conductive traces 12 of the PCB 10 using an electrical connection means 40, such as a plurality of fine gold or aluminum wires, or solder bumps, respectively. The semiconductor chip 2 and the electrical connection means 40 are encapsulated using a molding material, thereby forming an envelope 50 around them. The envelope 50 protects the chip 2 and the electrical connection means 40 from harmful electrical, mechanical and chemical agents in the environment surrounding the package 100. In the present invention, epoxy molding compound or "glop top" is preferably used as the encapsulating material of the envelope 50. However, it should be understood that other resins may be used in place of the epoxy molding compound or the glop top for the envelope 50 without affecting the function of this invention.

A solder ball 20, made of an Sn/Pb alloy, is welded to each of the solder ball lands 15 and 15a and is used as a signal input/output terminal of the package 100 during signal communication of the package 100 with a main board (not illustrated).

Figure 2B:
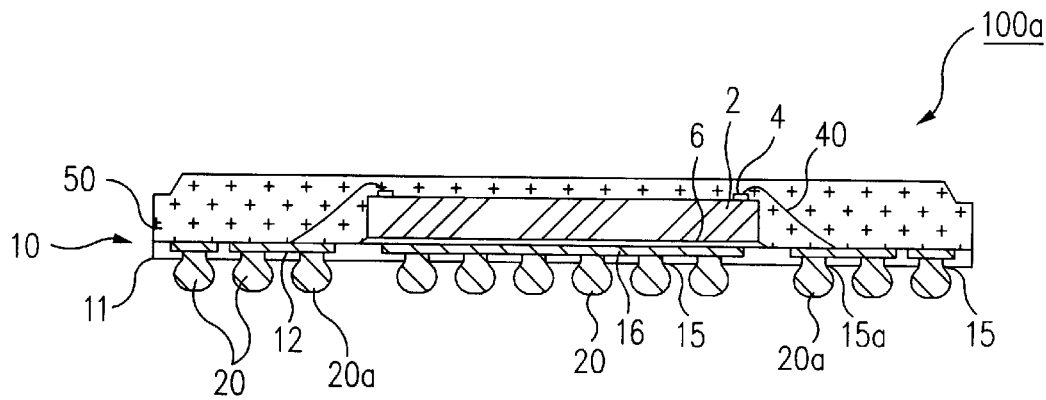
FIG. 2B is a sectional view of a BGA semiconductor package according to another embodiment of this invention, with a flexible circuit board being used in the package.

FIG. 2B is a sectional view of a BGA semiconductor package according to a second embodiment of this invention, with a flexible circuit board used in place of the rigid PCB used in the first embodiment. In this second embodiment, the shape of the BGA package 100a remains generally the same as that described for the embodiment of FIG. 2A. The construction of the package 100a different from that of the package 100 of FIG. 2A as follows.

The package 100a of FIG. 2B does not include any conductive via holes, solder masks and conductive traces, but instead, incorporates a flexible PCB 10 that has a thickness of 20–150 μm and a short, single-layered circuit pattern. The PCB 10 enables the package 100a to conform to the recent trend to small, compact, light, and thin packages.

In the package 100a of the second embodiment, the solder ball lands 15a positioned along the outside edge of the chip 2 have an oval configuration when viewed from the bottom of the package 100a. The solder ball lands 15a are arranged along the outside edge of the chip 2 such that the major axis of each land 15a is directed in either a generally radial direction relative to the center of the chip, or generally perpendicular to the outside edge of the chip 2, as best seen in FIG. 3E. In the package 100a, the configuration of both the chip pad 16 and the solder balls 21 thermally connected to it can be varied freely.

Figure 2C:
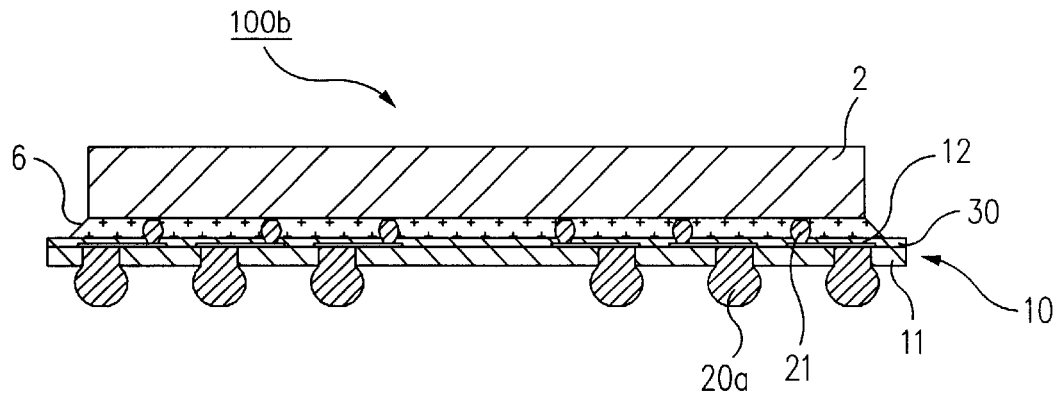
FIG. 2C is a sectional view showing the construction of a chip scale semiconductor package in accordance with a further embodiment of this invention.

FIG. 2C is a sectional view showing the construction of a chip scale semiconductor package in accordance with third embodiment of this invention. In the third embodiment, the shape of the BGA package 100b remains generally the same as that described for the embodiment of FIG. 2A. The construction of the package 100b differs from that of the package 100 of FIG. 2A as follows.

The package 100b of FIG. 2C, like that of the second embodiment, does not include any conductive via holes or conductive traces, and like the second embodiment, makes use of a flexible PCB 10 which has a thickness of 20–150 μm and a short, single-layered circuit pattern. This PCB 10 likewise enables the package 100b to conform to the recent trend toward packages that are small, compact, light and thin. In FIG. 2C, the reference numeral 21 denotes a plurality of small solder bumps which electrically connect the signal input/output pads (not shown) of the chip 2 to the conductive traces 12 in the so-called "flip-chip" mounting method. An insulating solder mask 30 coats the conductive traces 12. In FIG. 2C, the reference numeral 6 denotes a bonding layer that bonds the chip 2 to the upper surface of the PCB 10.

In the package 100b of this third embodiment, the solder ball lands 15a that are positioned under the chip 2 have an oval configuration when viewed from the bottom of the package 100b. These solder ball lands 15a are arranged under the chip 2 such that the major axis of each land 15a is directed in either a generally radial direction relative to the center of the chip, or generally perpendicular to an outside edge of the chip 2, as best seen in FIG. 3F.

FIG. 3A is a bottom view of the BGA semiconductor packages 100 and 100a of this invention. FIG. 3B is an enlarged view of the dotted portion B of FIG. 3A.

As shown in the drawings, the oval solder ball lands 15a are formed in a limited number on the bottom surface of the PCB 10 at a position along the edge of the chip pad 16 (see FIG. 2A), thus forming a rectangle around the chip 2. The solder ball lands 15a are arranged on the PCB 10 such that the major axis C–C' (see FIG. 3B) of each land 15a is directed in a generally radial direction relative to the center of the chip 2.

That is, the oval solder ball lands 15a of the above packages 100 and 100a are formed on the bottom surface of the PCB 10 and are arranged radially around the center of the chip 2 (or the chip pad 16). In detail, the "corner" solder ball lands 15a on the bottom surface of the PCB 10, i.e., those positioned at the corners of the chip 2, are oriented such that their major axis is aligned with a diagonal of the chip 2. On the other hand, the "central" solder ball lands 15a on the bottom surface of the PCB 10, i.e., those positioned at the center portion of the four sides of the chip 2, are oriented such that their major axis is perpendicular to the adjacent outside edge of the chip 2. The major axes of the solder ball lands 15a between the central solder ball lands 15a and the corner solder ball lands 15a are oriented in a generally radial direction relative to the center of the chip 2.

Each of the solder balls 20a that are welded to the oval solder ball lands 15a has a spherical configuration that is a result of the surface tension of the molten solder from which balls 20a are formed, even though the solder balls 20a are actually formed on the oval lands 15a. This spherical configuration is shown in enlarged detail in the sectional views respectively taken along the major axis C–C' and the minor axis D–D' of FIG. 3B.

It is preferable to control the surface area of each oval solder ball land 15a closely such that the height of a solder ball 20a formed on the oval land 20a is equal to the height of the solder balls 20 formed on each of the circular solder ball lands 15. Alternatively, the height of the solder balls 20 and 20a formed on the respective two types of lands 15 and 15a can be made the same by controlling the volume of the solder in the respective solder balls 20 and 20a. In addition, as a practical matter, it is also necessary that the maximum deviation in height of the solder balls 20 and 20a does not exceed 0.15 mm, or about 6 mils, and this rule must be strictly observed when designing the solder balls 20 and 20a of this invention.

In a different configuration from that of the above embodiment having the oval solder ball lands 15a arranged in one rectangular pattern around the chip 2, a plurality of oval solder ball lands 15a may be formed in two concentric rectangular patterns around the chip 2, as shown in FIG. 3C. In this embodiment, a plurality of oval lands 15a are arranged in an "inner" rectangular pattern, in the same manner as that described for the embodiment of FIGS. 3A and 3B, while the remaining oval lands 15a are arranged in an "outer" rectangular pattern. In this embodiment, the oval lands 15a are oriented such that the major axis of each land 15a is generally radially directed, relative to the center of the chip 2, except for the "central" solder ball lands 15a in each rectangular pattern, the major axes of which are oriented generally perpendicular to an adjacent edge of the chip 2.

Figure 3D:
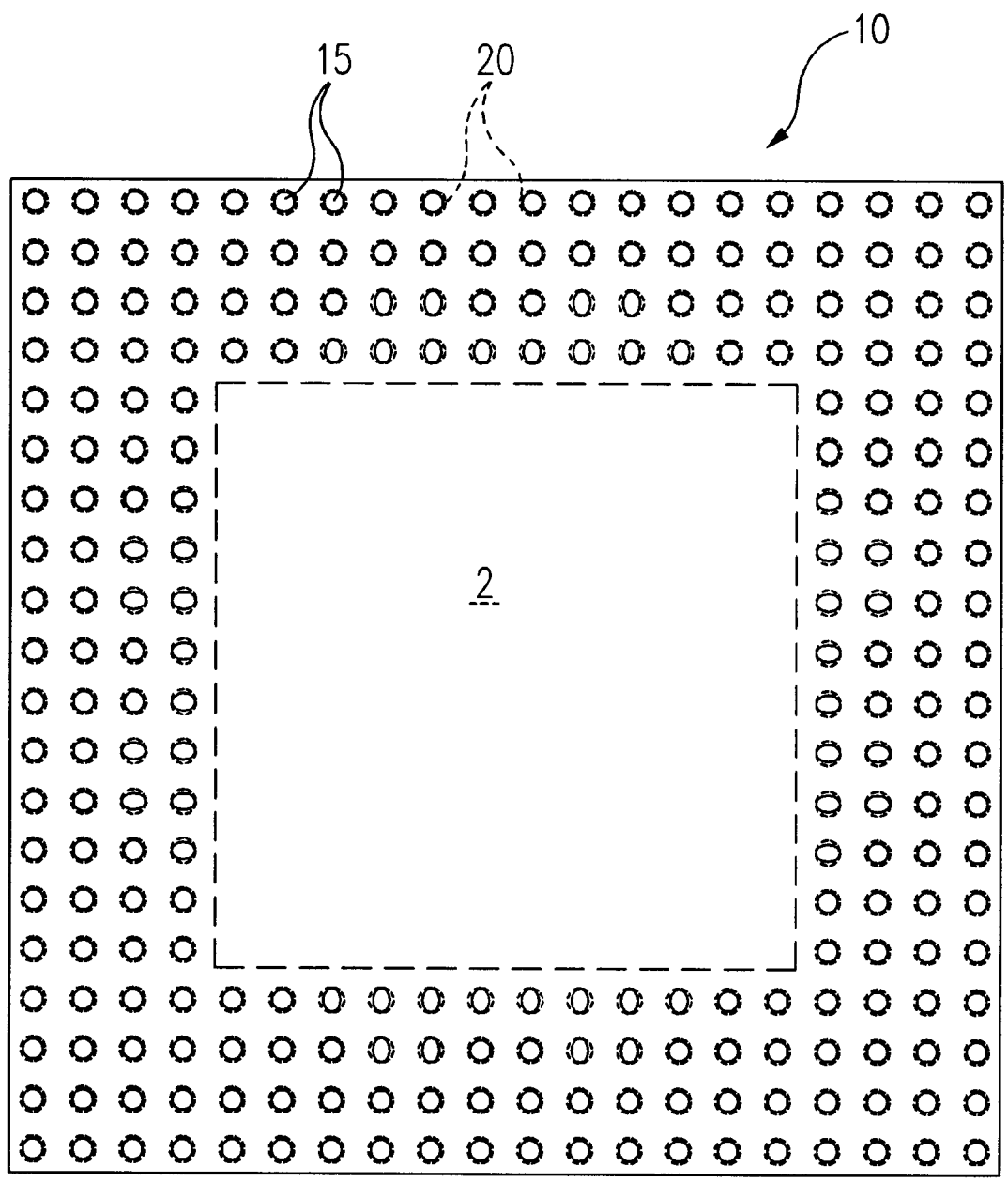
Figure 3E:
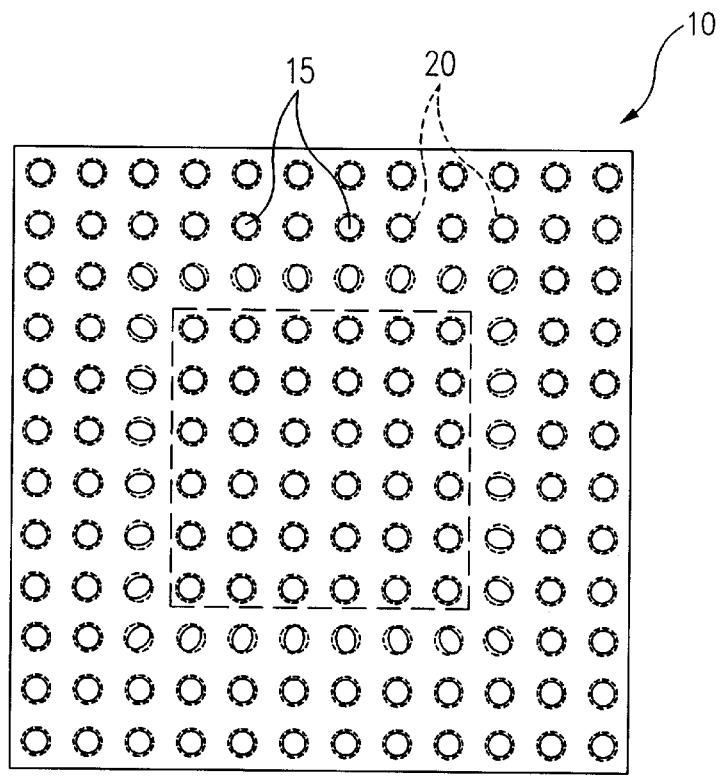
Figure 3F:
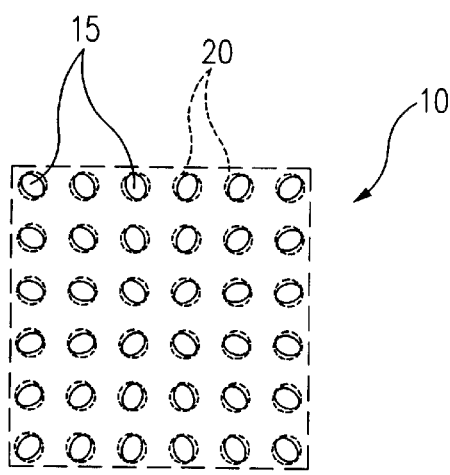

In accordance with a further embodiment of the invention, the oval solder ball lands 15a may be arranged on the bottom surface of the PCB 10 in inner and outer concentric rectangular patterns around the chip 2, as shown in FIG. 3D. In this embodiment, the oval lands 15a of the inside pattern are arranged in limited numbers at positions corresponding to the middle portions of the four sides of the chip 2, with the major axis of each land 15a being perpendicular to the adjacent edge of the chip 2. Since the positions at the middle portions of the four sides of the chip 2 are relatively closer to the center of the chip 2 than the positions around the corners of the chip 2, the object of this invention is accomplished by placing the oval lands 15a at these middle portions of the chip. On the other hand, the oval lands 15a of the outer pattern can be arranged symmetrically about the chip 2 in even more limited numbers at positions corresponding to the middle portions of the four sides of the chip 2, except for the central portions of the four sides, with the major axis of each oval land 15a being oriented generally perpendicular to the adjacent edge of the chip 2. Thus, in FIG. 3D, eight oval lands 15a are arranged in the inner rectangular pattern around the chip 2, while two sets of two oval lands 15a each are symmetrically arranged in the outer rectangular pattern around the chip 2, with two circular lands 15 being formed at the central portions of the chip 2 between the two sets of oval lands 15a.

FIG. 3E shows the bottom surface of a BGA semiconductor package 100a having a plurality of circular solder ball lands 15, each having a solder ball 20 on it, positioned directly below the area of the chip 2. It should be understood that the type of solder ball lands and the orientation of the major axis, if any, of each land positioned inside the area of the chip 2 may be freely varied without affecting the function of this invention. That is, in FIG. 3E, at least some of the lands inside the area of the chip 2 may be oval lands 15a, with the major axis of each oval land 15a being directed radially relative to the center of the chip 2, or perpendicularly to the outside edge of the chip 2.

FIG. 3F is a bottom view of the chip scale package 100b of this invention. In this embodiment, a plurality of oval solder ball lands 15a are arranged under the chip 10 such that their major axes are generally radially directed relative to the center of the chip 2.

Of course, it should be understood that the number and position of the oval solder ball lands 15a of this invention are not limited to those of the embodiments described above, if the BGA package has such oval lands 15a. In addition, the orientation of the oval lands 15a on the BGA package may be such that the major axes of the oval lands is radially directed relative to the center of the chip, perpendicularly directed relative to an edge of the chip, or both, without affecting the function of this invention.

During operation of a main board-mounted BGA package 100, 100a or 100b of this invention, the chip 2 generates heat, causing the PCB 10 to expand as a result of its rise in temperature. Since the solder balls 20 and 20a welded to the solder ball lands 15 and 15a of the package 100 are fixed to the main board, a shearing stress is applied to both the lands 15 and 15a, and the solder balls 20 and 20a, respectively, in a radial direction around the chip 2. In particular, the highest shearing stress acts on the lands 15, 15a and the solder balls 20, 20a that are positioned closest to the chip 2.

However, this thermal expansion shearing stress is effectively resisted by the oval lands 15a and the solder balls 20a welded to them, with the result that the BGA packages 100, 100a, and 100b this invention are almost immune from fracture of the solder balls caused by such thermal expansion shearing stress. That is, in the packages of this invention, the oval solder ball lands 15a are oriented such that their major axes are radially directed relative to the center of the chip, perpendicularly directed relative to the outside of the chip 2, or both. Therefore, the oval lands 15a and their associated solder balls 20a more effectively resist the shearing stress acting on them than do the conventional circular lands 15 and associated solder balls 20. This results because the oval lands 15a are arranged on the PCB 10 with their major axes oriented in generally the same direction as that in which the shearing stress acts, and thus, the length of the weld between each oval land 15a and its associated solder ball 20a is increased in the direction in which the shearing stress acts. This enables both the oval lands 15a and the solder balls 20a to more effectively resist the shearing stress than the conventional circular lands 15 and the solder balls 20.

Figure 4:
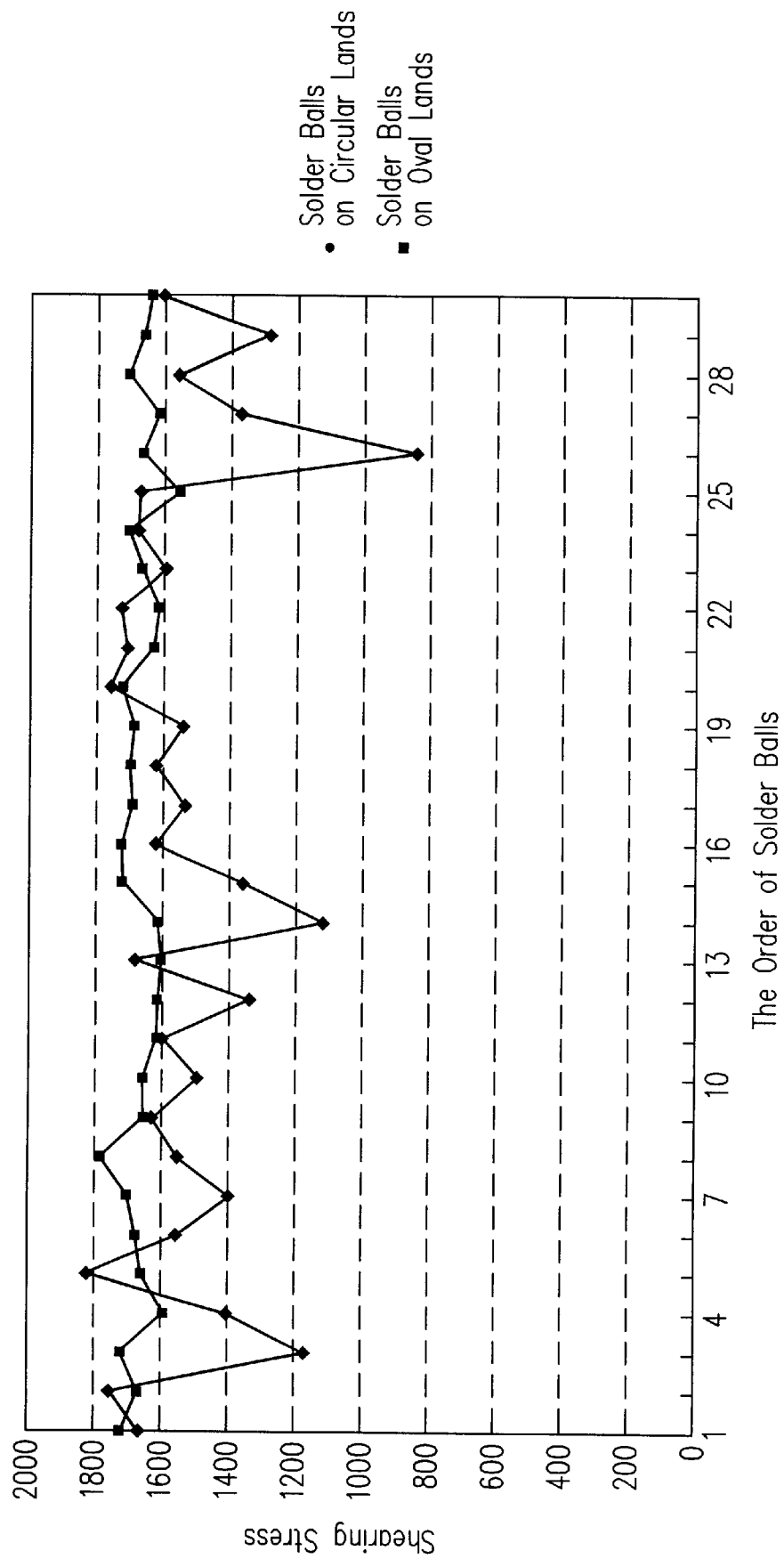
FIG. 4 is a graph showing normalized shearing stress as a function of the order of solder balls for both a BGA package of this invention and a typical BGA package; and, FIGS. 5a and 5b are views showing an arrangement of conductive traces of BGA packages according to the prior art and the present invention, respectively.

FIG. 4 is a graph showing the shearing stress in the solder balls, at fracture, for both a BGA package 100 of this invention, and for a typical BGA package 100', as a function of the (random) order in which the two types of packages were respectively tested. In the graph, the shearing stress at fracture, normalized by the area, in $cm^2$, of the solder ball attachment, is plotted on the vertical axis in units of grams-force ("g"), while the horizontal axis represents the numerical order in which both types of package were tested until the first occurrence of a solder ball fracture. In all cases, the failed solder balls were located within the innermost concentric rectangular pattern of solder balls centered around the chip 2. In addition, the oval solder ball lands were oriented such that the major axis of each oval land was directed perpendicular to the outside edge of the test chip 2.

The graph of FIG. 4 shows that, when the thermal expansion shearing force, acting in a radial direction from the center of the semiconductor chip 2 to the outside edges of the PCB, is gradually increased from 0 to 2,000 g, a first fracture of one of the circular solder balls of the conventional BGA package 100' occurs at a shearing stress of slightly greater than 800 g. In addition, the conventional package 100' has a shearing stress deviation of about 1,000 g between the maximum shearing stress and the minimum shearing stress at which solder ball fractures occur. Such a deviation is both significant and unacceptable.

However, in the case of the BGA package 100 of the present invention, with the major axis of each oval solder ball land being oriented in generally the same direction as that in which the shearing stress acts, the first fracture of an oval solder ball occurs at a shearing stress of not less than 1,500 g, as shown in the graph. Moreover, the package 100 of this invention has a shearing stress deviation of about 240 g between the maximum shearing stress and the minimum shearing stress at the fracture of the solder balls, which is a deviation that is both stable and much more acceptable. It should be noted that, when designing BGA packages, the shearing stress at which the first fracture of the solder balls occurs is relatively more important than the average shearing stress at which fracture of the solder balls occurs, because, as noted above, a BGA package typically fails totally when only one solder ball fractures.

The shearing stress test shows that the shearing stress at which the first fracture of one of the solder balls of the BGA package of this invention occurs is substantially increased (by about 180%), in comparison with a conventional BGA package. In addition, the package 100 of this invention also has a much narrower, and more acceptable, shearing stress deviation between the maximum shearing stress and the minimum shearing stress at which fracture of the solder balls occur, relative to the conventional package. That is, the shearing stress deviation of the novel package 100 is only about 24% of that of the prior art package 100'. This means that the fatigue life of the BGA package of this invention is substantially extended, relative to that of typical BGA packages, and hence, that the operational stability and reliability of the novel BGA packages are also substantially improved.

Figure 5A:
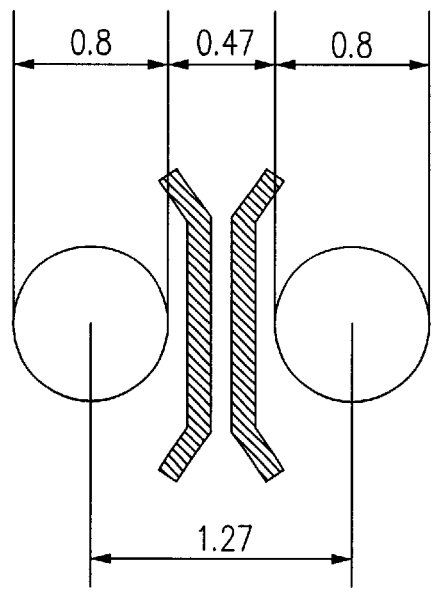
Figure 5B:
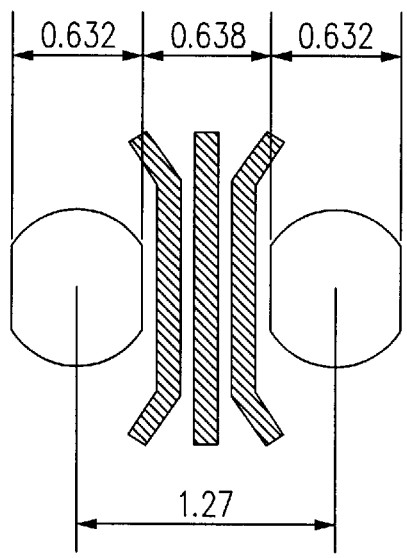

FIG. 5A shows an arrangement of the conductive traces of a typical BGA package 100' according to the prior art, while FIG. 5B shows an arrangement of the conductive traces of a BGA package 100, 100a or 100b of this invention. The typical conductive trace arrangement of FIG. 5A is well known to those skilled in the art, and so the following description focuses on the differences between the two arrangements of conductive traces.

When a PCB is manufactured according to a conventional 0.18 mm pitch design rule, it is possible for the typical BGA package 100' with both a solder ball pitch of 1.27 mm and a solder ball diameter of 0.8 mm to have only two or less conductive traces 13' in the neck point between the solder ball lands 15'. However, as may be seen in FIG. 5B, it is possible for the BGA package 100, 100a or 100b of this invention to have three conductive traces 13 in the neck point between the solder ball lands. This enables the BGA packages to have a desirable design flexibility that renders them capable of conforming to the recent trend toward small, compact, light and thin BGA packages. Moreover, the BGA packages 100, 100a and 100b of this invention have a higher operational reliability and are capable of being assembled in packages having higher density.

As described above, the present invention provides a PCB having a plurality of oval solder ball lands, and a BGA semiconductor package produced using such a PCB. In the package of this invention, the solder balls welded to the oval lands have an improved strength for effectively resisting shearing stress caused by thermal expansion of the PCB during operation. As a result, the package of this invention has a lengthened fatigue life capable of improving the operational reliability of BGA packages. The oval solder ball lands of this invention also enlarge the width of each neck point between adjacent solder ball lands, thereby enabling a larger number of conductive traces to be positioned within the neck point. This gives the BGA packages a desirable design flexibility capable of meeting the recent trend toward BGA packages that are smaller, more compact, lighter and thinner than previously possible. Therefore, the BGA packages of this invention have a high operational reliability and are capable of being assembled in high density packages.

Although the preferred embodiments of the present invention have been disclosed for illustrative purposes, those skilled in the art will appreciate that various modifications, additions and substitutions are possible, without departing from the scope and spirit of the invention, as defined by the accompanying claims.

What is claimed is:

1. A printed circuit board, comprising:
    a resin substrate having a chip-mounting pad disposed in a central portion of an upper surface thereof;
    a plurality of conductive traces disposed around said chip-mounting pad and forming a circuit pattern on said upper surface of said substrate; and,
    a plurality of solder ball lands defined on a lower surface of said substrate, said solder ball lands being radially symmetrical about a center of said chip-mounting pad and electrically connected to respective ones of said conductive traces on said upper surface thereof,
    a first portion of said solder ball lands each having an oval shape and a major axis, and being arrayed in a first rectangular perimeter located outside of and adjacent to an outer edge periphery of said chip-mounting pad.

2. The printed circuit board as claimed in claim 1, wherein said oval solder ball lands are oriented such that their major axes are directed in a generally radial direction relative to the center of said chip-mounting pad.

3. The printed circuit board as claimed in claim 1, wherein said oval solder ball lands are oriented such that their major axes are perpendicular to an outside edge of said chip-mounting pad.

4. The printed circuit board as claimed in claim 1, wherein a part of said oval solder ball lands are oriented such that their major axes are directed in a generally radial direction relative to the center of said chip-mounting pad, and the remaining part of said oval solder ball lands are oriented such that their major axes are perpendicular to an outside edge of said chip-mounting pad.

5. The printed circuit board as claimed in claim 1, wherein each of a second portion of said solder ball lands has an oval shape and a major axis, and is arrayed in a second rectangular perimeter located outside of and adjacent to said first rectangular perimeter.

6. The printed circuit as claimed in claim 1, wherein each of said solder ball lands is defined on said lower surface of said substrate by an opening, through said substrate.

7. A semiconductor package, comprising:
- a printed circuit board comprising a resin substrate having a plurality of first conductive traces forming a circuit pattern on an upper surface thereof;
- a rectangular semiconductor chip mounted on a central portion of said upper surface of said substrate;
- electrical connection means for electrically connecting said semiconductor chip to said first conductive traces on said printed circuit board;
- a plurality of solder ball lands defined on a lower surface of said substrate, said solder ball lands being radially symmetrical about a center of said semiconductor chip and electrically connected to respective ones of said first conductive traces on said upper surface thereof,
- a first portion of said solder ball lands each having an oval shape and a major axis, and being arrayed in a first rectangular perimeter located outside of and adjacent to an outer edge periphery of said semiconductor chip; and,
- a plurality of solder balls welded to respective ones of said solder ball lands and comprising signal input/output terminals of said package.

8. The semiconductor package as claimed in claim 7, wherein said oval solder ball lands are oriented such that their major axes are directed in a generally radial direction relative to said center of said semiconductor chip.

9. The semiconductor package as claimed in claim 7, wherein said oval solder ball lands are oriented such that their major axes are perpendicular to an outside edge of said semiconductor chip.

10. The semiconductor package as claimed in claim 7, wherein a part of said oval solder ball lands are oriented such that their major axes are directed in a generally radial direction relative to the center of said semiconductor chip, and the remaining part of said oval solder ball lands are oriented such that their major axes are perpendicular to an outside edge of said semiconductor chip.

11. The semiconductor package as claimed in claim 7, wherein said solder ball lands comprise a plurality of circular solder ball lands and a plurality of oval solder ball lands, and wherein each of said solder balls has a maximum deviation in height of less than 0.15 mm (6 mil).

12. The semiconductor package as claimed in claim 7, further comprising an envelope encapsulating said semiconductor chip and said electrical connection means to protect them from harmful environmental elements outside of the package.

13. The semiconductor package as claimed in claim 12, wherein said electrical connection means comprises a plurality of conductive wires, wherein said solder ball lands are formed on said lower surface of said substrate, and wherein said printed circuit board further comprises:
- a chip-mounting pad formed on a central portion of said upper surface of said substrate, said plurality of first conductive traces forming an upper circuit pattern on said upper surface of said substrate around said chip-mounting pad;
- a plurality of second conductive traces forming a second circuit pattern on said lower surface of said substrate, each of said second conductive traces having respective one of said solder ball lands integral thereto;
- a plurality of conductive via holes formed through said substrate and electrically connecting selected ones of said first and second conductive traces to each other; and,
- a solder mask coating formed over respective ones of said upper and said lower surfaces of said substrate, except at openings in a respective one of said masks located at said solder ball lands, said chip-mounting pad, and at inside ends of said first conductive traces.

14. The semiconductor package as claimed in claim 13, wherein adjacent ones of said oval solder ball lands are spaced at a pitch of 1.27 mm, wherein said solder balls have a diameter of 0.8 mm, and wherein three of said second conductive traces pass through a neck point between two of said adjacent ones of said oval solder ball lands.

15. The semiconductor package as claimed in claim 12, wherein said electrical connection means comprises a plurality of solder bumps, and wherein said first conductive traces are individually coated with a solder mask on an upper surface thereof.

16. The semiconductor package as claimed in claim 7, wherein each said solder ball land comprises a layer of nickel and a layer of gold.

17. The semiconductor package as claimed in claim 7, wherein each of a second portion of said solder ball lands has an oval shape and a major axis, and is arrayed in a second rectangular perimeter located outside of and adjacent to said first rectangular perimeter.

18. The semiconductor package as claimed in claim 7, wherein each of said solder ball lands is defined on said lower surface of said substrate by an opening through said substrate.

\* \* \* \* \*